United States Patent [19]

Brown

[11] 4,156,201
[45] May 22, 1979

[54] BINARY WORD PRESENCE INDICATING CIRCUIT

[75] Inventor: James L. Brown, Toddville, Iowa

[73] Assignee: Rockwell International Corporation, El Segundo, Calif.

[21] Appl. No.: 872,520

[22] Filed: Jan. 26, 1978

Related U.S. Application Data

[62] Division of Ser. No. 734,492, Oct. 21, 1976.

[51] Int. Cl.² .......................................... H03K 13/32
[52] U.S. Cl. .................................... 328/119; 328/206; 328/109
[58] Field of Search ................. 328/119, 120, 37, 111, 328/112, 206, 109

[56] References Cited
U.S. PATENT DOCUMENTS

3,601,706  8/1971  Battle ................................. 328/119
3,987,313  10/1976  Pfleiderer et al. ..................... 328/37

*Primary Examiner*—John S. Heyman
*Attorney, Agent, or Firm*—Richard A. Bachand; Bruce C. Lutz; H. F. Hamann

[57] ABSTRACT

Apparatus for detecting a serial binary number includes a flip-flop connected to receive the words among which the word to be detected is contained at an input, and connected to receive the complement of the word to be detected at a reset terminal. The flip-flop operates to present a first output state when the word to be detected is applied to its input and a second output state when another word is applied to its input. A second flip-flop is connected to receive the output from the first flip-flop and is clocked by a signal to test the output state of the first flip-flop at the termination of each word applied to its input. The output of the second flip-flop is, therefore, indicative of the presence of the word to be detected at the input of the first flip-flop.

1 Claim, 2 Drawing Figures

BINARY WORD PRESENCE INDICATING CIRCUIT

This is a division of application Ser. No. 734,492, filed Oct. 21, 1976.

Figure 1:
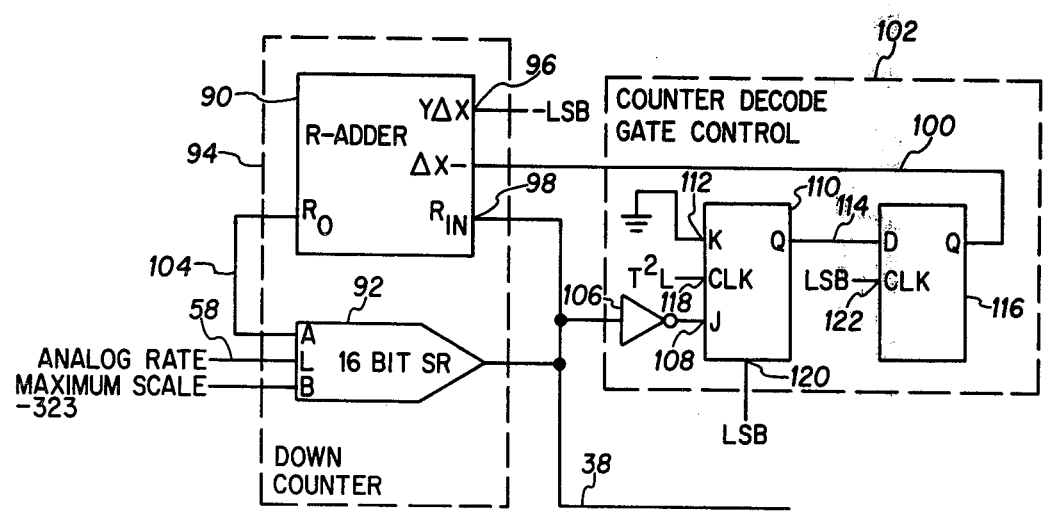
Figure 2:
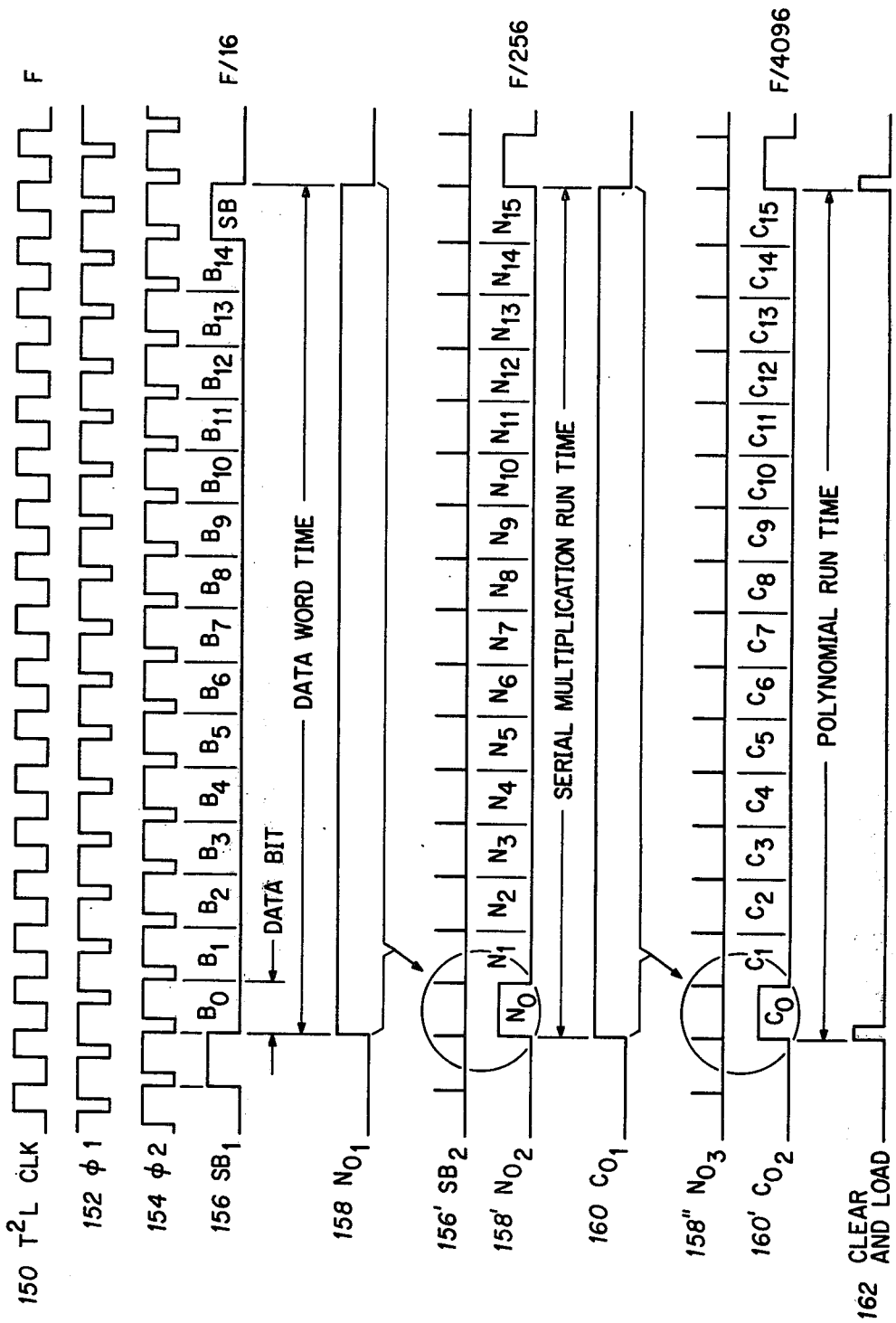

The present invention may be ascertained from a reading of the specification and appended claims in conjunction with the drawings wherein:

FIG. 1 is a detailed schematic diagram of one set of circuit apparatus for implementing a variable scale generator, and FIG. 2 is a timing diagram for use in understanding the invention.

FIG. 1 uses an R adder 90 and a shift register 92 within a down counter block 94. The maximum scale number is loaded into shift register 92 when an incoming signal is received on analog rate line 58. The R adder acts to subtract a negative least significant bit on lead 96 to the minus number output of shift register 92 as applied to input 98. (This effectively results in an addition.) The input on a lead 100 from a counter decode and gate control block 102 is normally logic 1. This input is to a subtract input and thus a negative number is subtracted from a negative number which effectively results in decrementing the absolute value by changing the incoming number on lead 98 to a number which is closer to 0. This number is output on lead 104 and returned to the shift register 92 for further circulation. The down counter 94 is acting in an accumulator fashion similar to block 34 of FIG. 1 without the limiting function. The signal appearing on scale output lead 38 is continuously changing as the counter is counting down but as will be determined later this changing number does not adversely affect the operation of the circuit. The unique section of FIG. 3 is the counter decode. As will be noted, the signal on lead 38 is inverted by an inverter 106 before being applied to a J input 108 of the JK flip-flop 110. The K input 112 of JK flip-flop 110 is connected to ground or reference potential while its Q output is supplied on a lead 114 to a D flip-flop 116. The flip-flop 110 has a T²L signal supplied to a clock input 118 the timing of which is illustrated in the timing diagram of FIG. 4. A reset input 120 contains a LSB serially applied word which is the complement of the word applied to input 108 and which will one word time later actuate the flip-flop 116 such that the output on 100 is altered to a logic 0 and the down counter 94 in the form of R adder 90 no longer changes the number in shift register 92. A clock input 122 for D flip-flop 116 also receives a LSB serially applied word.

FIG. 2 comprises a plurality of waveforms showing the interrelationship of a basic frequency waveform 150 which is used to generate phase 1 and phase 2 clocks 152 and 154, respectively. Although waveforms 152 and 154 are not shown specifically in the schematic diagrams, the two different phases are used to overcome timing problems between various logic gates. A sign bit or sync bit shown as waveform 156 occurs every 16 pulses of the basic frequency 150. The time between sign bit pulses is designated as waveform 158 and is a complete data word time. As will be noted, there are 16 data bits per data word. The sync bit is also presented as waveform 156' along with the data word $N_o$ waveform 158' on a scale of frequency/256 so as to illustate waveform 160 which covers a time frame of 16 data words and is the time necessary for a series of multiplications to occur in a device for multiplying one word times a second word. Such a multiplication is required in apparatus such as may be found in U.S. Pat. No. 3,829,672 issued Aug. 13, 1974 and pertaining to the solving of square roots.

It may be noted at this point that a waveform similar to 156 except that the pulse occurs during time $B_o$ is representative of a digital word LSB.

To monitor and stop the countdown process, JK flip-flop 110 and D flip-flop 116 are used. The countdown in the illustrated embodiment is in an organized pattern which will always contain a zero except for the case of the stop word −LSB which is all "ones". It is only necessary to check each word for the presence of a zero and once a word which contains all "ones" (−LSB) is in the shift register the countdown process is stopped. The shift register output on lead 38 is monitored each word time for the presence of a logic zero in the circulating word. However, since a subtraction of a −LSB is in process, the word −2LSB (the word immediately preceding −LSB) must be detected (i.e. 0111111111111111). The countdown process is then stopped with the result of the last subtraction. The shift register then circulates −LSB through the adder with no further change because the input 100 ($\Delta X-$) is changed from a logic one to a logic zero. The word −2LSB (0111111111111111) has the zero in LSB position which is ignored by using +LSB (1000000000000000) as reset for the JK F/F 110 and leaving the JK Q output on 114 at a logic zero. (Note: A JK F/F with K=0 can only change the Q output to a logic 1 when J=1 on the rising edge of a clock. J returning to a zero and subsequent clocking will not change Q from a logic 1 level.) By including the inverter 106 between the J input 108 and shift register output, the absence of logic zeros in the countdown word is detected, and the countdown process is stopped the following word time. The D F/F 116 detects the JK F/F output on 114 and provides a one word wide (the width of an "N"pulse see FIG. 2, graph 158') $\Delta X-$ subtract or not subtract command to the adder 90 for the following word time.

Although a particular number was discussed as being detected by decode 102, it will be realized that some other numbers can be detected by changing the makeup of the complementary word applied to reset input 120 to maintain the output of the JK flip-flop in a logic 0 condition for an entire word time. Other numbers may require alteration of circuit components and logic approach as will be obvious to one skilled in the art. (I.e., to detect +LSB, the input 118 would need to be $\phi_1$ instead of T²L and also the J input would be connected directly to 104 while input 96 would receive +LSB rather −LSB.).

While the present inventive concept has been discussed with regard to a specific preferred embodiment, it is to be realized that the inventive concept may be practiced by those skilled in the art using other components and techniques and thus I wish to be limited only by the scope of the appended claims.

What is claimed is:

1. Apparatus for detecting a particular multi-bit serial binary number from among unknown serial binary numbers comprising,
    a J-K flip-flop having J and K inputs, an output and a reset means, said K input connected to a logic "0" level, and said J input connected to receive said unknown serial binary numbers;

a first source of clock pulses connected to said clock input of said J-K flip-flop to clock said J-K flip-flop at a frequency of said unknown serial binary numbers;

means for applying to said reset means of said J-K flip-flop the complement of the multi-bit serial binary number to be detected in synchronism with said unknown serial binary numbers;

a D flip-flop having a D input, a clock input, and an output, said D input being connected to receive said output of said J-K flip-flop;

a second source of clock pulses connected to said clock input of said D flip-flop to clock said D flip-flop concurrently with a last bit of said binary numbers, whereby after said particular multi-bit serial binary number appears, said D flip-flop changes state.

* * * * *